United States Patent
Springthorpe

[11] 3,975,751
[45] Aug. 17, 1976

[54] MONOLITHIC LIGHT-EMITTING DIODE AND MODULATOR

[75] Inventor: Anthony John Springthorpe, Richmond, Canada

[73] Assignee: Northern Electric Company Limited, Montreal, Canada

[22] Filed: Sept. 19, 1974

[21] Appl. No.: 507,454

[52] U.S. Cl. .................................. 357/19; 357/17; 357/55
[51] Int. Cl.² ................. H01L 31/12; H01L 31/16
[58] Field of Search ............... 357/17, 19, 55, 18; 332/7.51

[56] References Cited
UNITED STATES PATENTS

| | | | |
|---|---|---|---|
| 3,458,703 | 7/1969 | Migitaka | 250/199 |
| 3,617,929 | 11/1971 | Strack | 331/94.5 |
| 3,723,903 | 3/1973 | Paoli | 331/94.5 M |
| 3,724,926 | 8/1971 | Lee | 330/4.3 |
| 3,768,037 | 10/1973 | Migitaka | 332/7.51 |
| 3,828,231 | 8/1974 | Yamamoto | 357/30 |

Primary Examiner—Martin H. Edlow
Attorney, Agent, or Firm—Sidney T. Jelly

[57] ABSTRACT

For a reversed bias double heterostructure diodes, particularly GaAs diodes, electroabsorption can be obtained with reverse bias and light emission can be obtained with forward bias. However bulk absorption is large at wavelengths close to the band edge, where light emission occurs. Thus light emission through a modulator at zero bias is low. By providing for the light emulsion to be at a larger wavelength than that corresponding to the band edge high modulation efficiencies can be obtained. This is achieved by suitably doping the emitter differently as compared with the modulator so that light emission occurs at wavelengths greater than that at the fundamental energy gap.

8 Claims, 13 Drawing Figures

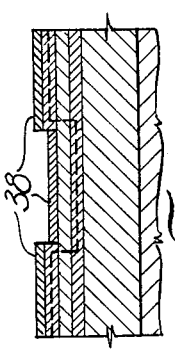
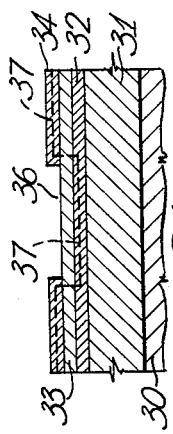
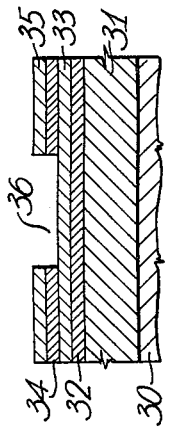
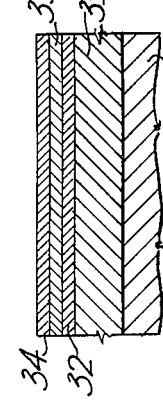
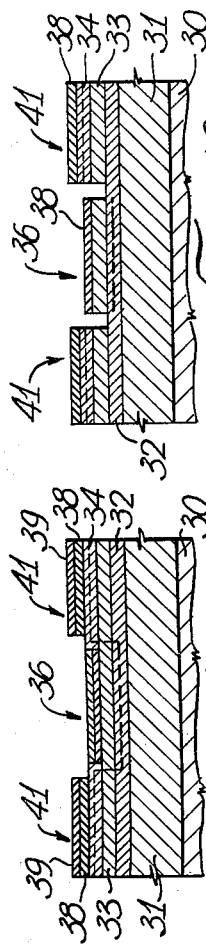
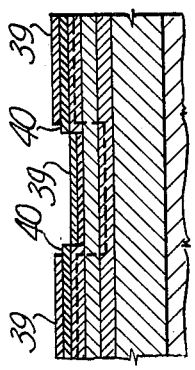
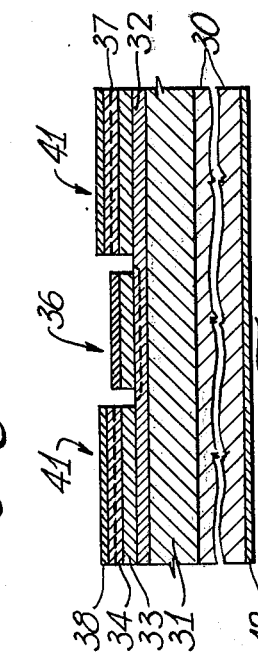
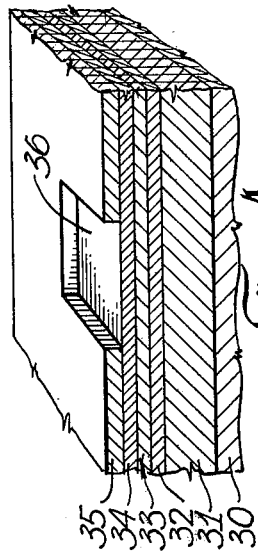

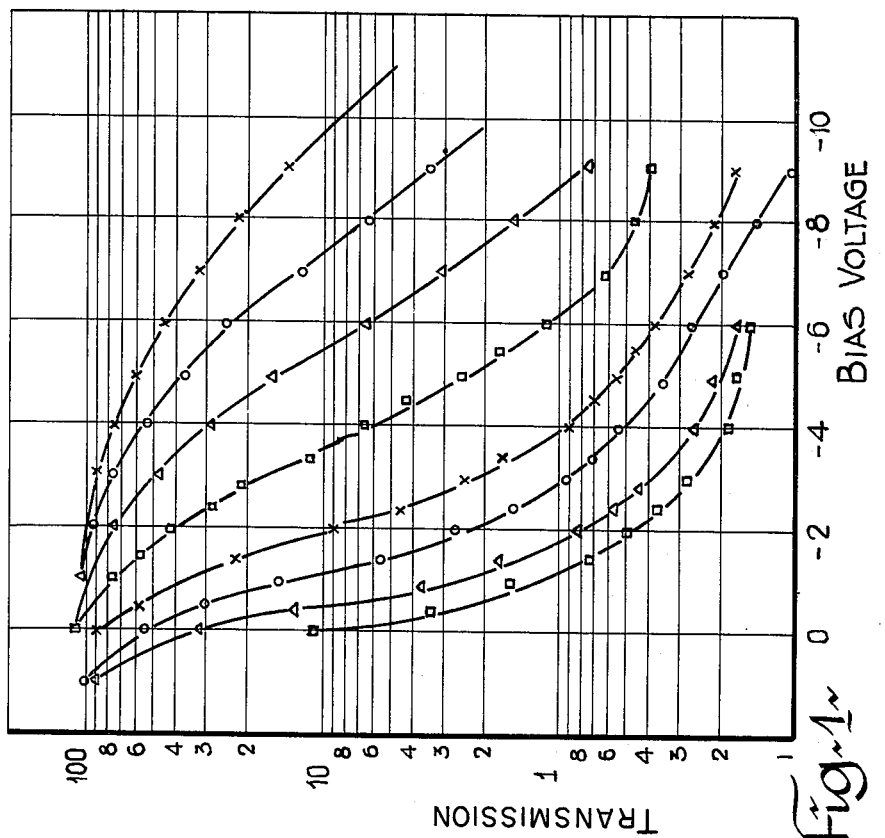
Fig-1
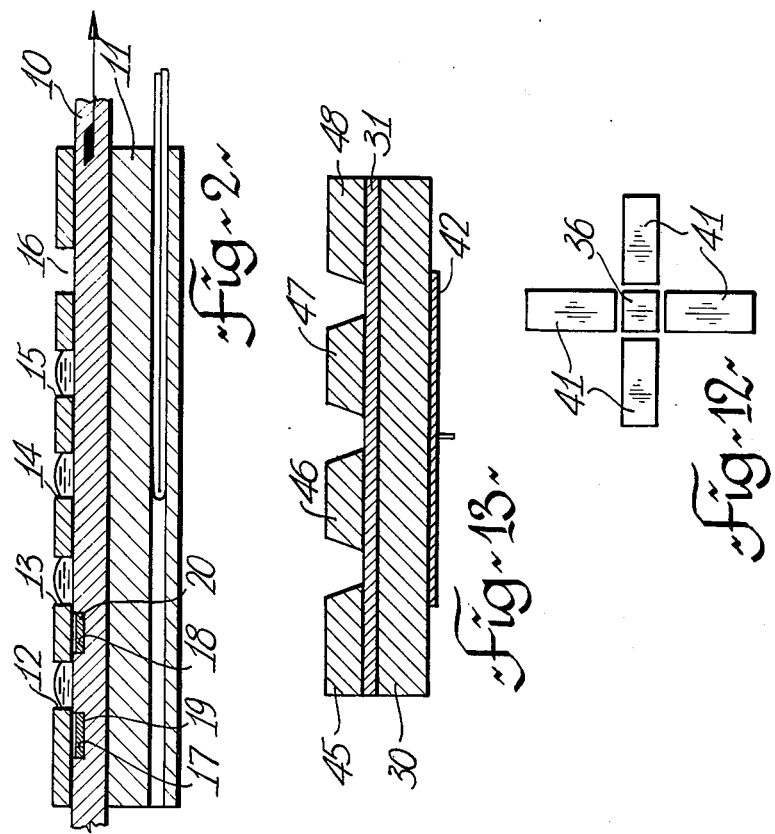
Fig-2
Fig-12
Fig-13

MONOLITHIC LIGHT-EMITTING DIODE AND MODULATOR

This invention relates to a monolithic lightemitting diode and modulator.

It has been found that electroabsorption occurs in reverse biased double heterostructure diodes, particularly GaAs diodes, for example as described by F. K. Reinhart, in Applied Physics Letters, Vol. 22., Apr. 15, 1973. Efficient modulation of infrared wavelengths in the neighbourhood of 9000A can be achieved by the application of relatively low bias voltages. It is also possible to forward bias a similar structure diode and obtain light emission, such light emission occurring at a peak which is near the band edges (8600A) for GaAs. However, for GaAs, bulk absorption is large at wavelengths close to the band edge and, although a monolithic structure would have a high modulation efficiency, the light transmission through the modulator in the zero bias state would be low.

The present invention provides for a monolithic light-emitting diode and modulator in which the light emission at the diode is arranged to be at a longer wavelength than that corresponding to the band edge. In this arrangement high modulation efficiencies can be achieved and the on-off ratio will be larger than that for the case when the emission occurs at the band edge. To achieve this effect the emitter is doped differently from the modulator so that it produces light emission a wavelengths greater than that at the fundamental energy gap.

The invention will be readily understood by the following description by way of example in conjunction with the accompanying drawings, in which:

FIG. 1 is a series of curves illustrating the light absorption characteristics of a double heterostructure p-n junction as a function of applied reverse-bias voltage;

FIG. 2 is a diagrammatic cross-section through an apparatus for forming a four layer structure;

FIGS. 3 to 10 illustrate diagrammatically the various stages in the production of a double heterostructure, in accordance with the present invention;

FIG. 11 is a diagrammatic cross-section through a light emitter and two modulators;

FIG. 12 is a plan view of a fourway modulator device;

FIG. 13 illustrates diagrammatically the application of the invention to logic elements.

FIG. 1 illustrates the absorption characteristics of GaAs double heterostructures. The absorption is illustrated related to the applied bias. Transmission decreases (i.e. absorption increases) rapidly with increase in reverse bias. The curves are representative of different wavelengths passing through the active layer. The active GaAs layer, in the ecample considered, is a low-doped n-type material ($\sim 10^{16}$ electrons/cm$^3$).

In a diode having an active layer of GaAs, the peak emission occurs near the band edge — at approximately 8600A. At this wavelength the absorption by a GaAs layer is high. An emitter-modulator monolithic pair would therefor be inefficient. However, by doping the emitter differently to that of the modulator, the emitter can be caused to produce light emission at wavelengths greater than that of the fundamental energy gap — and thus an effective modulator can be obtained.

A suitable structure is produced from a conventional double heterostructure having a confined active layer of undoped n-type ($\sim 10^{16}$ electrons/cm$^3$). The heterostructure is a four layer structure and is produced by a standard source seed liquid phase epitaxial technique, such as is described in the paper "Preparation of GaAs p-n junctions by Multiple-Layer Liquid Phase Epitaxy" by B. I. Miller and H. C. Casey Jr., paper number 24 in the 1972 symposium on GaAs. One typical form of apparatus for multiple layer structures is described in Canadian Patent No. 902,803, issued on June 13, 1972.

Briefly, the method for growing a four layer structure is as follows, referring to the diagrammatic illustration in FIG. 2. As illustrated in FIG. 2, a carbon slider 10 slides laterally as indicated by the arrow, in a carbon holder 11. The holder 11 has a series of wells, 12, 13, 14, 15 and 16. In the slider 10 are two recesses 17 and 18 in which are placed two wafers 19 and 20. In the example, wafer 19 is the substrate on which is to be grown four further layers.

The wells 12, 13, 14 and 15 contain liquid phase epitaxy solutions as follows (the GaAs being in excess):

| Well | Gallium | GaAs | Al | Te | Sn | Ge | GaP |
|------|---------|-------|-----|-----|-----|------|-------|
| 12 | 4 gm | 250mg | 6mg | 2mg | — | — | 100mg |
| 13 | 4 gm | 350mg | — | — | 2mg | — | — |
| 14 | 4 gm | 250mg | 7mg | — | — | 150mg | 100mg |
| 15 | 4 gm | 350mg | — | — | — | 60mg | — |

The gallium (6N grade) and GaAs (polycrystalline undoped) are loaded into all the wells 12, 13, 14 and 15 in the carbon holder 11 and placed in a silica furnace tube, slider 10 in position to close off the bottoms of the wells. The tube is evacuated and back-filled with Pd-diffused high purity H$_2$ (This is repeated several times). A flow of $\sim 1$ liter/min. of H$_2$ is then maintained through the tube and it is inserted inside a furnace at 950°C where it is left for >2 hours. This baking serves to drive off unwanted impurities and reduces the background impurity level in the grown layers to >5 ×10$^{15}$ carriers/cm$^3$.

The tube is then removed from the furnace and quenched (in air) to room temperature. When cold the gas flow is changed to N$_2$ for $\sim 15$ mins and then the carbon holder 11 and slider 10 are removed and stored in a laminar flow area.

The substrate wafer 19 and source wafer 20 are then etched to remove any remaining mechanical damage after the polishing. Typical etch; 3:3:1 (H$_2$O : HNO$_3$ : HF) 1 min at 0°C.

After etching they are rinsed thoroughly in DI water and then blown dry with a stream of dry N$_2$. The wafers are then inserted into the substrate and source recesses 17 and 18 in the carbon slider 10 and the dopants are then added to the solutions in the four wells 12, 11, 14 and 15. The assembled carbon-ware is then reloaded into the silica furnace tube and the gas is changed to H$_2$ as before. The furnace is reset to $\sim 830$°C and the tube is reinserted so that the carbon-ware is in a flat-zone region so that the temperature difference along the length of the boat is <1°C. After $\sim 2$ hours of equilibration and saturation the slider 10 is pushed so that the source wafer 20 comes beneath the solution in well 12 where it is left for $\sim 30$ minutes to cause the solution in well 12 to reach equilibrium. The temperature cooling programme is then initiated at $\sim 0.1$°C/min (other rates are possible) and the slider 10 is pushed so that the substrate wafer 19 now comes beneath the first solution in well 12. The source wafer is then beneath well 13 to equilibrate solution two. Epitaxial crystal growth occurs on the substrate as the slice cools from 830°–820°C a first layer (~4 m thick of $Ga_{0.65}Al_{0.35}$ As doped n-type with a carrier concentration of ~$10^{18}$/cm$^3$) is given.

At 820°C the slider 10 is again pushed so that the substrate wafer 19 is positioned beneath the second solution in well 13, where it stays for ~1°C cool to grow a second layer, an n-type (~$10^{16}$/cm$^3$) layer of GaAs ~1μm thick. The source wafer 20 is beneath the third solution in well 14 to equilibrate this solution.

At 819°–817°C the slider 11 pushed to move wafer 19, the third layer is grown of composition ~$10^{18}$/cm$^3$ and thickness ~1μm.

At 817°–816°C the slider is moved to position the wafer 19 beneath well 15 and the final layer of GaAs is grown doped p-type to ~$10^{18}$/cm$^3$ also with thickness of ~1μm.

The slider is then pushed on so that the growth is terminated, and the furnace tube can then be withdrawn and air-quenched.

After removal of the substrate from the cooled carbon-ware it is boiled in HC1 to remove all traces of Ga adhering to the edges which could interfere with subsequent processing. The structure is then as illustrated in FIG. 3, the substrate at 30, the first layer GaAlAs n-type at 31, the second layer GaAs n-type at 32, the third layer GaAlAs p-type is at 33, and the final layer GaAs p-type is at 34. Layer 34 can be referred to as the capping layer, layer 33 as the confining layer, layer 32 as the active layer and layer 31 as a further confining layer.

After cleaning, the slice is coated on the grown surface with a photoresist layer 35, and emitter pads areas 36 are defined using a suitable mask. The exposed photoresist in the region of the pad is etched away to bare the grown surface. This is shown in FIG. 4. The top layer 34 of p-GaAs is then etched away (where it is exposed) using a 30% $H_2F_2$ solution neutralized with $NH_4OH$ such as is described by — B. Schwartz, J. C. Dyment, and S. E. Haszko, in the 1972 GaAs Symposium published by The Institute of Physics (London), pages 187–196. This can be carried out in an ultrasonic bath, etch rate ~6μm/hr, and the etch stops automatically at the p-GaAlAs layer 33 beneath the GaAs (FIG. 5). The photoresist layer 35 is then stripped off and the slice is dipped in buffered HF for ~60 seconds, to remove oxide films on the exposed GaAlAs surface 33, rinsed and dried. It is then placed immediately in a furnace for zinc-diffusion. Various Zn-diffusion sources and thermal cycles are possible; e.g. a $ZnAs_2$ source in a semisealed capsule at 700°C for ~45 mins. The diffusion time is dependent on the composition of the GaAlAs layer 33 and also on the thickness. The zinc is diffused through the GaAlAs layer 33 and ~50% of the way into the n-type GaAs active layer 32 creating a p-n junction in the active layer 32, as illustrated in FIG. 6 the diffusion indicated at 37.

After diffusion a 2000A layer of gold 38 is evaporated onto the slice while it is maintained at 200°C (FIG. 7). It is then recoated with a photoresist layer 39 and the emitter-modulator pattern is exposed, using a different mask from the first emitter mask. After exposure the photoresist is developed leaving a protective coat on the slice only in the region of the emitter and the modulator, such that there is ~2 mil of bare Au-coated slice inbetween. This is seen at 40 in FIG. 8. The exposed gold is stripped with warm (~50°C) $KI-I_2$ sol[n], exposing the GaAs surface 34 (FIG. 9) which is then etched, in the same way as described previously, down to the GaAlAs layer 33. The photoresist layer 39 is then stripped-off and the final etching stage is carried out to electrically isolate the emitter area 36 from the modulator areas 41. This involves etching in concentrated HF until the GaAlAs layer 33 is completely removed from the emitter area 36 and modulator areas 41. The structure is then as in FIG. 10. To check on the removal the electrical isolation between the emitter and modulator pads can be monitored, as, when isolation is complete, the IV characteristic will appear as two back-to-back diodes.

The n-side contact layer 42 is then applied to the opposite side of the slice, 4000A Au/12% Ge evaporated and then alloyed at 450°C for 3 minutes in an inert atmosphere.

The slice can then be broken up to isolate individual emitter-modulator pairs followed by bonding, using conventional techniques, to a suitable package. FIG. 12 illustrates an emitter/modulator package comprising a central emitter 36 and four modulators 41 providing a fourway modulator device. Each modulator can be operated independently of the other modulators.

By causing the emitter to be doped differently in the active layer, by the zinc diffusion, the light emission wavelength is increased, as stated above. The emission is then at an efficient absorption wavelength for the modulator structure. Thus, for example, forward biasing of the emitter 36 will cause light of wavelength ~9000A to be emitted and the intensity of their emission can effectively be controlled by the confined active layer 32 at the modulator 41 by the application of a reverse bias.

It is possible to produce a similar structure using three layers — combining capping layer 34 and confining layer 33. In such an arrangement it will be necessary to etch a step in this layer to initially define the emitter region or area, in a similar manner as capping layer 34 is etched to define the emitter in FIGS. 4 and 5. Alternatively it is possible to produce a similar structure by utilizing a passivating layer of phosphorus doped $SiO_2$ glass (or $Si_3N_4$) on the surface. Such layers are impervious to Zn diffusion. Thus if the $SiO_2$ glass layer is removed in the region of the emitter, controlled diffusion in selected areas is possible. The definition of these areas can be achieved using established photoresist technology using the masks as previously described above.

The present invention can also be used to fabricate monolithic opto-electronic logic elements, for example an AND gate. This is illustrated diagrammatically in FIG. 13. On a common substrate 30 are produced the emitter 45, first and second modulators 46 and 47, and a photo-detector 48. The form of the emitter is as previously described, for example emitter 36 in FIGS. 3 to 10, and the modulators 46 and 47 of the form of the modulator 41 in FIGS. 3 to 10. The photo-detector 48 can be similar to the emitter structure as 36 in FIGS. 3 to 10, but used as a detector.

Modulators 46 and 47 are normally biased in the off state — for example — lov. bias. Only if two simultaneous signals are applied to the modulators 46 and 47, returning the bias to ~0V, will light be detected by the integrated photo-detector.

What is claimed is:

1. A monolithic light emitting diode and modulator structure, comprising:

a substrate of semiconductor material of one conductivity type, and sequential layers of semiconductor material on one major surface of said substrate, said layers comprising a first confining layer on said surface of said substrate, an active layer on said first confining layer and a second confining layer on said active layer, said first confining layer of the same conductivity type as said substrate, the second confining layer of opposite conductivity type as said first confining layer, and said active layer of the same conductivity as said first confining layer;

a first contact layer on another major surface of said substrate opposed to said one surface and a second contact layer on said second confining layer, said second contact layer composed of separate spaced apart portions electrically isolated to form one portion defining a light emitting section and a further portion defining a light modulating section, said first contact layer common to said light emitting and light modulating sections, said first contact layer and said portion of said second contact layer for the light emitting section providing means for applying a forward bias to said light emitting section, and said first contact layer and said portion of said second contact layer for the modulator section providing means for applying a reverse bias to said modulator section;

said active layer extending continuously across said light emitting and light modulating sections, and including a region doped to produce a p-n junction for said light emitting region removed from the interface between said active layer and said second confining layer, a p-n junction extending between said active layer and said second confining layer for the remainder of said structure, for allowing light emission from said light emitting section at a wavelength larger than the band edge of said modulator section.

2. A structure as claimed in claim 1, said p-n junction for said light emitting region being positioned in said active layer.

3. A structure as claimed in claim 1, including a capping layer on said second confining layer, said second contact layer on said capping layer.

4. A structure as claimed in claim 1, said second confining layer extending only beneath said separate spaced apart portions of said second contact layer.

5. A structure as claimed in claim 1, said second confining layer including an electrically insulating region between said separate spaced apart portions of said second contact layer.

6. A structure as claimed in claim 5, said insulating region a proton bombarded region.

7. A structure as claimed in claim 1, comprising an emitter section, first and second modulator sections and a photodetector in sequence and optical alignment on said substrate.

8. A structure as claimed in claim 7, said first confining layer, said active layer and said first contact layer common to said light emitting section, said modulator sections and said photo detector, said second contact layer including a further portion spaced from and electrically isolated from said portions for said light emitting and said modulator sections, said further portion defining said photo detector, said active layer including a region doped to produce a p-n junction in said active layer at said photo detector, said further portion of said second contact layer and said first contact layer providing means for obtaining an output from said photo detector.

* * * * *